United States Patent [19]

Lim

[11] Patent Number: 5,451,895

[45] Date of Patent: Sep. 19, 1995

[54] WIDEBAND AMPLIFIER WITH LOGARITHMIC OUTPUT CHARACTERISTIC

[75] Inventor: Arthur J. Lim, Menlo Park, Calif.

[73] Assignee: Lumisys, Inc., Sunnyvale, Calif.

[21] Appl. No.: 141,404

[22] Filed: Oct. 22, 1993

[51] Int. Cl.⁶ .............................................. G06F 7/556
[52] U.S. Cl. ................................... 327/351; 327/350; 327/362; 330/279
[58] Field of Search ........................ 307/491, 492, 493; 328/145; 330/310, 279, 285; 327/530, 350, 351, 362

[56] References Cited

U.S. PATENT DOCUMENTS

| | | | |
|---|---|---|---|
| 4,990,803 | 2/1991 | Gilbert | 307/492 |
| 5,077,541 | 12/1991 | Gilbert | 330/284 |
| 5,216,384 | 6/1993 | Vanhecke | 330/279 |

OTHER PUBLICATIONS

Analog Devices, "Dual, Low Noise, Wideband Variable Gain Amplifiers AD600/AD602", Rev.0 (1992).

*Primary Examiner*—Timothy P. Callahan
*Assistant Examiner*—Jeffrey Zweizig
*Attorney, Agent, or Firm*—Schneck & McHugh

[57] ABSTRACT

A wideband amplifier which employs a plurality of cascaded logarithmic amplifier stages under the control of a digital signal processor which nulls offset voltages. In one aspect of the invention, the digital signal processor controls switches, one switch associated with each amplifier stage for determining an appropriate offset voltage and producing a counterbalancing signal. In another aspect of the invention the amplifier includes two potentiometers or variable signal devices which can set the overall input signal level and set the ratio of maximum to minimum of the input signal level, respectively, to desired levels. In a third aspect of the invention, a lookup table is associated with the digital signal processor for storing correction factors to be applied to digitized values in order to produce a final result which is corrected for variations in the amplifier characteristic from true logarithmic.

16 Claims, 1 Drawing Sheet

WIDEBAND AMPLIFIER WITH LOGARITHMIC OUTPUT CHARACTERISTIC

TECHNICAL FIELD

The invention relates to electrical signal amplifiers and in particular to such a multi-stage amplifier having a wideband output characteristic.

BACKGROUND ART

Amplifiers having a gain characteristic which is exponential have a voltage transfer function which may be expressed as:

$$V_{out} = A \log V_{in}/V_{ref}$$

where A is a gain factor, $V_{in}$ is an input voltage and $V_{ref}$ is a reference voltage. Diode-based circuits, which inherently possess this transfer function, are susceptible to temperature variations and are also subject to a logarithmic reduction in frequency response with decreases in signal level. In recent years circuits have been developed which can provide a logarithmic output over a respectable dynamic range of input signal levels. A data sheet published by Analog Devices for the AD600 variable gain amplifier mentions that the circuit can handle inputs from 100 μV to 1 V rms with a constant measurement bandwidth of 20 Hz to 2 MHz and a logarithmic transfer function. Improved bandwidth characteristics are obtained by using a R-2R resistor network as the input to a difference amplifier. This is more fully described in U.S. Pat. No. 5,077,541 to B. Gilbert. One of the main advantages of using the R-2R resistor network is that the effect of temperature variations are greatly reduced. Moreover, frequency response is relatively constant over a far greater bandwidth than can be achieved with diode-based circuitry.

It has been previously recognized that R-2R wideband amplifiers can be cascaded and achieve very high gain linearity over a 100 dB range.

One of the problems introduced in cascading stages is that there are uncompensated offsets between stages which can affect linearity and dynamic range of the output. The offsets vary with gain and so prior cascaded circuits usually use AC coupling. A problem with AC coupling is that the amplifiers cannot operate at low or zero frequencies.

An object of the invention was to devise a wideband logarithmic amplifier having circuitry for reducing the effect of offset voltages at low frequency and DC levels.

SUMMARY OF INVENTION

The above object has been achieved with a wideband amplifier employing a plurality of cascaded logarithmic amplifier stages connected with a digital signal processor which controls switches for nulling offset voltages in the cascaded stages. The variable gain amplifier stages are arranged in a gain control loop with an output of the last stage fed back to an input of each stage. Each stage is provided with a switch having one position connecting one variable gain stage to the next and another position for zeroing the input to a respective gain stage allowing for selective isolation of offset voltages from the plurality of voltage gain stages. The digital signal processor includes an analog-to-digital converter for taking an output of the last cascaded gain stage and controlling the switches for reading offset voltages contributed by each stage and then producing counterbalancing signals nulling the offset voltages. A multichannel digital-to-analog converter feeds the counterbalancing signals to each of the gain stages for minimizing the offset voltage produced by the combination.

A memory forms a look-up table for applying a correction to the digitized signal so that any variations from a true logarithmic characteristic can be corrected. The final output from the device is a digital representation of the input signal which is proportional to the logarithm of the input voltage.

BEST MODE FOR CARRYING OUT THE INVENTION

Figure 1:
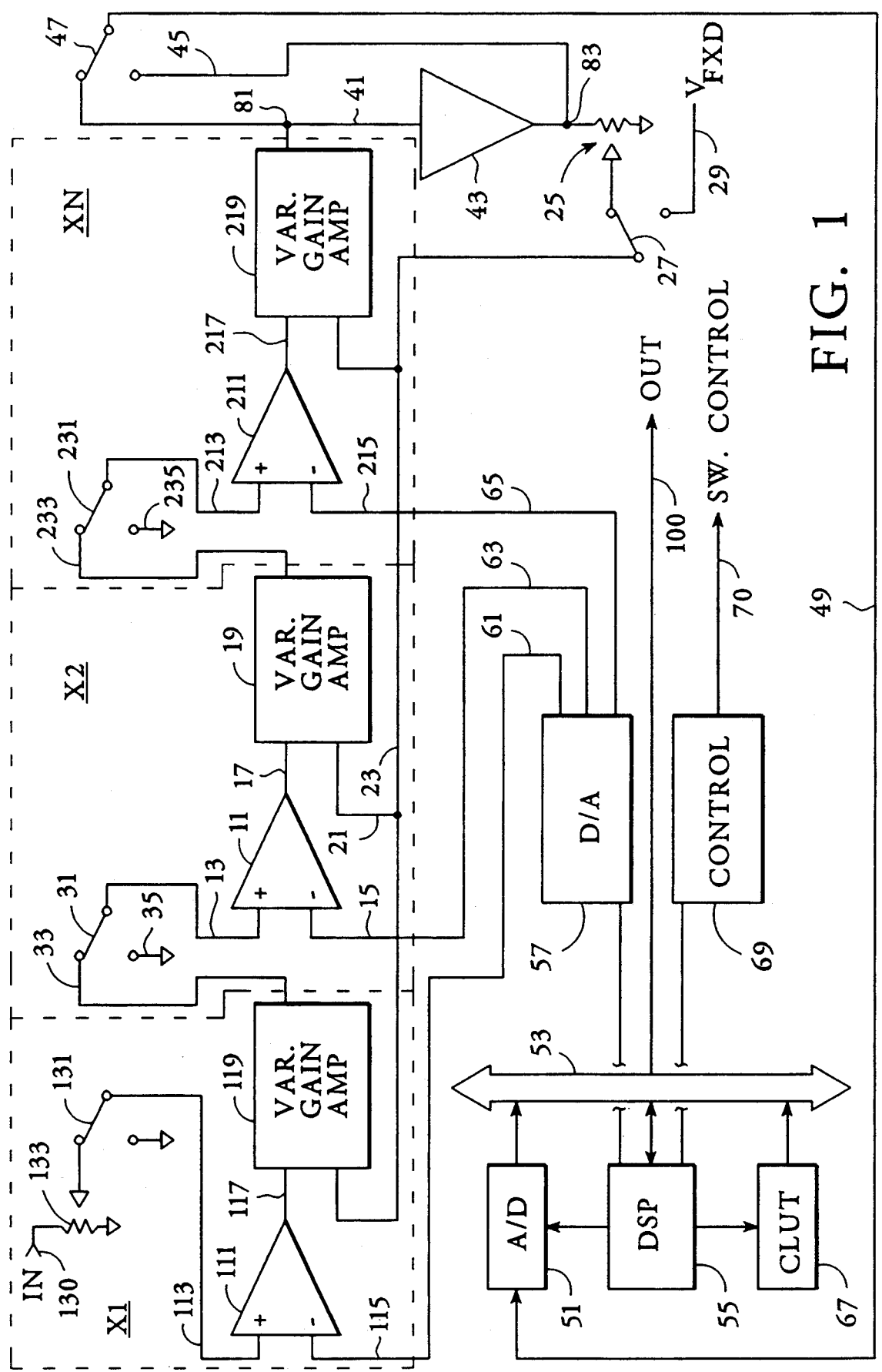
FIG. 1 is a circuit block diagram of a wideband amplifier in accord with the present invention.

With reference to FIG. 1, a plurality of variable gain amplifier stages are shown, X1, X2 and XN. Each variable gain amplifier stage, such as X2, includes a differential amplifier 11 having a pair of inputs 13 and 15 and an output 17 feeding a logarithmic amplifier 19 ("log amplifier"). The signal along line 21 to the log amplifier 19 is a voltage signal whose level sets the gain of the amplifier. The signal along line 23 to input 21 of the log amplifier 19 controls the gain of the log amplifier in such a way that the gain is logarithmically proportional to the voltage. When switch 231 is connected to position 233 and switch 27 is connected as shown then the signal line 23 forms a feedback loop with log amplifiers 19, 119 and 219 which acts to maintain signal 41 at a fixed voltage and signal 83 at a voltage which is logarithmically proportional to the signal on output 17. Signal 83 is the desired output of the invention and can be connected to the analog to digital converter 51 by means of switch 47.

The variable feedback potentiometer 25 controls the amount of signal which is fed back to the log amplifiers 19, 119 and 219 and sets the constant of proportionality of the logarithmic output.

Switch 31 allows the input to the X2 stage to be selected as either the output from the previous stage, X1 or else set to ground. Input 15 to the X2 stage allows a fixed offset voltage to be added or subtracted from the input signal 17 until the output 233 from the stage is zero with zero input.

The XN stage also has a difference amplifier 211 with first and second inputs 213 and 215. Input 213 comes from the preceding X2 stage wherein the output of log amplifier 19 may be selected as the input for difference amplifier 211. The switch 231 allows isolation of the difference amplifier from the preceding stage by connection to ground terminal 235. The output of amplifier 211 is fed along line 217 to log amplifier 219. The common input 23 sets each of the log amplifiers 19, 119 and 219 for logarithmic amplification. In other words, the cascaded variable gain amplifier stages, X1, X2, . . . , XN span a desired dynamic range.

Each of the log amplifiers 19, 119, 219 is preferably a section of an Analog Devices AD600 amplifier. These amplifiers have R-2R ladder networks for establishing a logarithmic transfer function in a manner described in U.S. Pat. No. 5,077,541.

The output of the XN amplifier, taken along line 41, is transmitted to open-loop gain amplifier 43 and used to derive a voltage through the potentiometer 25 and switch 27 to form the closed loop path. The output of the fixed gain amplifier may also be taken along output line 45 through switch 47 and applied along line 49 to an A/D (analog-to-digital) converter 51. Alternatively, for the purpose of measuring offset voltages, switch 47 may directly take the output of the last stage and apply it to line 49 without passing through amplifier 43.

The A/D converter 51 produces a digital signal applied to a bus 53. Digital signals on the bus can be inputs to a digital signal processor 55 which has several functions. One function is to set the switches 31, 131, 231, 27 and 47 in order to set the appropriate zero for each stage. A second function is to read the offset by sampling the output of the A-D converter and applying a counterbalancing signal to the input of each stage. The counterbalancing signal is applied through a D-A converter 57 which sends outputs along lines 61, 63 and 65 to each of the variable gain amplifiers 19, 119 and 219. The counterbalancing signals are applied while the overall gain is fixed at near maximum in order to achieve the greatest possible range of signal input amplitudes. A third function is to take the output of the A/D when the switches 27, 47, 31, 131 and 231 are in their operating positions and to apply the value as a correction factor to the input of the correction table (CLUT) 67 in order to obtain the final result which is corrected for variations in the result from the true logarithmic.

The A-D converter 51 receives a logarithmic output signal along line 49 from line 45. As an alternative, switch 47 may be moved to connect node 81 with line 49 in which case the open loop signal is applied for zeroing purposes. The two variable potentiometers 133 and 25 provide adjustments for the overall range of signal inputs. Potentiometer 25, a second variable signal means, sets the ratio of maximum to minimum input voltages, while potentiometer 133 determines initial input voltage levels. For example, potentiometer 25 could be used to adjust for a range of 5,000:1 (74 dB) and the potentiometer 133 could then set the voltage level to be between 10 volts maximum and 0.002 volts minimum. All switches are set by the switch control unit 69 operating under instructions from the digital signal processor 55. That is, while the potentiometers 25 and 133 are manually adjustable, they are connected to switches 27 and 131, respectively, which control whether potentiometers 25 and 131 are actuated. During self-adjustment, switch 27 is set so as to open the loop and fix the overall gain at near maximum. Switch 47 is set so as to connect the X1, . . . , XN outputs directly to the input of A-D converter 51. With the switches 27 and 47 set in this position, the zeroing process controlled by the digital signal processor is as follows.

First, switch 231 zeroes the input to the XN amplifier. The D-A converter 57 sets the "offset 3" signal on-line 65 to mid-range. Next, the output from variable gain amplifier 219 is read. The output, offset 3, is changed by half its remaining range in the direction to drive the output toward zero. This sequence is repeated until A-D converter reads zero or else a preset number of halving procedures is accomplished. Next, the switch 231 is restored to the connection with line 233 and the switch 31 is set to zero the input to difference amplifier 11. The previous procedure is repeated, this time varying the output of D-A converter 57, "offset 2", along line 63. Next, switch 31 is restored and switch 131 is set to zero the input to amplifier 111. Again, the sequence described above is repeating, this time varying the output of D-A converter 57, "offset 1", along line 61. This completes the auto-zero process. Switches 27 and 47 are restored to their normal positions and the device is ready for data acquisition.

There will be some residual uncompensated offset voltages, as well as offset present on the input signal. The effect of these offsets becomes more evident as the input signal becomes small and the amplifier gain becomes correspondingly large. To preserve accuracy of the logarithmic characteristic, lookup table 67 stores values allowing corrections for small input signals. Desired values may be stored in the lookup table for any input signal and then called by the digital signal processor. The corrected digital signal is transmitted as an output signal along line 100.

The dynamic range of the output signal can be varied by adjusting the bias voltages using the potentiometers 133 and 25. The dynamic range can be increased by cascading further stages. Although three stages were shown in FIG. 1, any number of stages, N, can be used to achieve the desired dynamic range.

I claim:

1. A wideband amplifier of electrical signals comprising,
   a plurality of cascaded analog variable gain amplifier stages each having an input, an output and an offset adjustment terminal,
   a digital signal processor operatively associated with said gain amplifier stages and having means for setting the gain of said variable gain amplifier stages, said digital signal processor connected to transmit at least one signal to an offset adjustment terminal of said plurality of cascaded amplifier stages and having an amplifier output, and
   an analog to digital converter connected to receive an analog output from the plurality of cascaded amplifier stages and to feed a digital input to the digital signal processor.

2. The amplifier of claim 1 further defined by selective connections between the digital signal processor and the offset adjustment terminal of each of the plurality of cascaded analog amplifier stages.

3. The amplifier of claim 1 wherein each of said plurality of cascaded analog amplifier stages has a logarithmic transfer function.

4. The amplifier of claim 1 wherein each of said plurality of cascaded analog amplifier stages comprises a difference amplifier connected to a logarithmic amplifier.

5. The amplifier of claim 1 wherein said means for setting the gain of said variable gain stages comprises a first variable signal means for setting the overall level of the signal input and a second variable signal means for setting the ratio of maximum to minimum of said signal input level, said first and second variable signal means actuated by said digital signal processor.

6. The amplifier of claim 1 further defined by a memory connected to the digital signal processor for storing correction factors to be applied to the output of the analog to digital converter.

7. A wideband amplifier of electrical signals comprising,
   a plurality of amplifier gain stages having a logarithmic output transfer function, each gain stage having an input, an output and a characteristic offset voltage, said plurality of amplifier gain stages arranged in a series, X1, X2, . . . , XN, forming a gain control loop wherein a first output of the XN amplifier is fed back to the input of the X1 amplifier, a plurality of N−1 switches, one associated with the input to each of the X2, . . . , XN amplifier gain stages, each switch having a first position connecting one gain stage to the next in said series, the XN gain stage connected to the X1 stage, and a second position zeroing the input to a respective gain stage thereby selectively isolating offset voltages from the plurality of gain stages, a digital signal processor means, including an analog to digital converter stage, connected to the output of the XN stage, for controlling said switches, for reading isolated offset voltages, for producing counter-balancing signals nulling said offset voltages and for producing an output signal with correction factors for variations from a true logarithmic characteristic, and a digital to analog converter connected to receive said counterbalancing signals and to transfer said signals to said plurality of amplifier gain stages.

8. The amplifier of claim 7 further comprising a memory means, associated with said digital signal processor means, for storing said correction factors.

9. The apparatus of claim 7 wherein each of said gain stages comprises a difference amplifier connected to a logarithmic amplifier stage.

10. The apparatus of claim 7 wherein the output of said plurality of amplifier gain stages is connected to a gain amplifier.

11. The apparatus of claim 10 wherein said gain amplifier is selectively connected to said output of said plurality of amplifier gain stages.

12. A wideband amplifier of electrical signals comprising, a plurality of variable gain amplifier stages having a logarithmic output transfer function, each stage having an input and an output, said plurality of variable gain amplifier stages arranged in a cascaded series, X1, X2, . . . , XN, forming a gain control loop wherein a first output of the XN amplifier is fed back to the input of the X1 amplifier, each amplifier stage having a characteristic offset, a first variable signal means associated with one of said gain amplifier stages for setting the overall signal input level and a second variable signal means associated with one of said gain amplifier stages for setting the ratio of maximum to minimum of said signal input level, a digital signal processor means, including an analog to digital converter stage, connected to control a switch for said first and second variable signal means, and a digital to analog converter connected to said digital signal processor means for providing a plurality of signals nulling the characteristic offset of each variable gain amplifier stage.

13. The apparatus of claim 12 wherein each of said gain stages comprises a difference amplifier connected to a logarithmic amplifier stage.

14. The apparatus of claim 12 wherein the output of said plurality of amplifier gain stages is connected to a fixed gain amplifier.

15. The apparatus of claim 12 wherein said fixed gain amplifier is selectively connected to said output of said plurality of amplifier gain stages.

16. The amplifier of claim 12 further defined by a memory connected to the digital signal processor for storing correction factors to be applied to the output of the analog to digital converter.

* * * * *